(12) United States Patent
Weber et al.

(10) Patent No.: US 8,185,166 B2
(45) Date of Patent: May 22, 2012

(54) THERMAL SPRAY COATING FOR SEAMLESS AND RADIO-TRANSPARENT ELECTRONIC DEVICE HOUSING

(75) Inventors: Douglas Weber, Arcadia, CA (US); Naoto Matsuyuki, Okazaki (JP); David A. Pakula, San Francisco, CA (US); Evans Hankey, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 552 days.

(21) Appl. No.: 12/343,335

(22) Filed: Dec. 23, 2008

(65) Prior Publication Data

US 2010/0103612 A1 Apr. 29, 2010

Related U.S. Application Data

(60) Provisional application No. 61/108,460, filed on Oct. 24, 2008.

(51) Int. Cl.
*H04M 1/00* (2006.01)
(52) U.S. Cl. ............... 455/575.1; 455/575.7; 455/575.8; 361/679.56; 361/705; 361/807; 361/815
(58) Field of Classification Search ............... 455/575.1, 455/575.5, 575.7, 575.8
See application file for complete search history.

(56) References Cited

U.S. PATENT DOCUMENTS

| | | | | |
|---|---|---|---|---|
| 2,817,604 | A * | 12/1957 | Louis | 427/108 |
| 4,570,166 | A * | 2/1986 | Kuhn et al. | 343/872 |
| 4,586,115 | A * | 4/1986 | Zimmerman et al. | 362/217.08 |
| 5,327,149 | A * | 7/1994 | Kuffer | 343/720 |
| 5,355,144 | A * | 10/1994 | Walton et al. | 343/713 |
| 5,382,383 | A * | 1/1995 | Hirai et al. | 252/501.1 |
| 5,748,155 | A * | 5/1998 | Kadunce et al. | 343/713 |
| 6,270,853 | B1 * | 8/2001 | Brown et al. | 427/470 |
| 6,334,938 | B2 * | 1/2002 | Kida et al. | 204/298.13 |
| 6,388,621 | B1 * | 5/2002 | Lynch | 343/700 MS |
| 6,399,903 | B1 | 6/2002 | Stevenson | |
| 7,005,404 | B2 * | 2/2006 | He | 502/325 |
| 2004/0036646 | A1 * | 2/2004 | Suzuki et al. | 342/70 |
| 2007/0008227 | A1 | 1/2007 | Napoles et al. | |
| 2009/0135015 | A1 * | 5/2009 | Dobson et al. | 340/572.9 |

OTHER PUBLICATIONS

Search Report dated Dec. 4, 2009 from International Application No. PCT/US2009/056393.
Written Opinion dated Dec. 4, 2009 from International Application No. PCT/US2009/056393.
U.S. Appl. No. 10/884,172, filed Jul. 2, 2004.
U.S. Appl. No. 11/501,184, filed Aug. 7, 2006.

* cited by examiner

*Primary Examiner* — Kent Chang
*Assistant Examiner* — Magdi Elhag
(74) *Attorney, Agent, or Firm* — Beyer Law Group LLP

(57) ABSTRACT

Electronic devices and other apparatuses adapted to receive electromagnetic wave communications are disclosed. An outer housing encloses various device components, including at least an internal antenna located fully therewithin and adapted to receive/send communications from/to an outside source via RF or other electromagnetic waves. A ceramic coating can be a thermal spray coating that covers at least a portion of the outer surface proximate to the internal antenna, and can be "RF transparent"—adapted to allow communications to/from the internal antenna via electromagnetic waves. The outer housing can be plastic, metal or a combination thereof. For metal or other non-RF transparent housings, an RF-transparent insert can be fitted into a window in the housing to permit communications to the internal antenna. The ceramic coating covers some or all of the metal, plastic and/or insert that comprise the outer housing and surface for a final aesthetic finish to the device.

27 Claims, 4 Drawing Sheets

THERMAL SPRAY COATING FOR SEAMLESS AND RADIO-TRANSPARENT ELECTRONIC DEVICE HOUSING

CROSS REFERENCE TO RELATED APPLICATION

This application claims priority to U.S. Provisional Patent Application No. 61/108,460, filed Oct. 24, 2008, and entitled "THERMAL SPRAY COATING FOR SEAMLESS AND RADIO-TRANSPARENT ELECTRONIC DEVICE HOUSING," which is incorporated herein by reference in its entirety and for all purposes.

TECHNICAL FIELD

The present invention relates generally to portable computing devices, and more particularly to the formation of outer housings for such portable computing or other personal devices.

BACKGROUND

Portable computing devices, such as media players, cellular telephones, PDAs and the like, are becoming omnipresent. With a multitude of manufacturers competing for sales of these devices in retail markets, the need to provide state of the art features and content on a device that very aesthetically pleasing is increasing. This is particularly true given the nature of consumers to desire portable computing devices that are "hip" or "cool" looking, with many purchasing decisions for such devices being affected by this particular desire. Accordingly, the outer look or feel of a portable computing device can be a critical factor in device design.

One design challenge associated with portable computing devices is the composition and appearance of the outer housing or enclosure that is used to house the various internal components of the portable computing device. A seamless, smooth and/or sleek look is often highly desired, with metal or other similar materials being preferable. Some solutions to these issues have involved the use of an outer housing that is tubular in nature. Various examples of and methods of manufacturing such tubular outer housings can be found in, for example, commonly owned U.S. patent application Ser. Nos. 10/884,172 and 11/501,184, filed on Jul. 2, 2004, and Aug. 7, 2006 respectively, both of which are entitled "HANDHELD COMPUTING DEVICE," and both of which are incorporated by reference herein in their entireties and for all purposes. Such outer housings can be used on, for example the iPod® media player or iPhone® cellular telephone made by Apple Inc., among other suitable portable computing devices or items.

One drawback to a common approach of manufacturing a generally metallic outer housing for a portable computing device is that metal can be a poor material choice where electromagnetic wave transmissions through the material are desired. For example, a cellular telephone that requires radio frequency transmissions to operate must either have an external antenna or a region in the housing through which radio waves can pass. As a more detailed example, because no external antenna was used on the iPhone® 2G cellular telephone made by Apple Inc., its metallic outer housing included a plastic portion located proximate to an internal antenna or receiver region. This design permitted most of the outer housing to be aluminum, but also required a smaller region of plastic to allow for radio frequency communications through the outer housing.

Unfortunately, the use of two different materials for the outer housing results in a seam between the materials, as well as the likelihood of a two-toned look in the overall look of the device. One solution to avoid such seams and two-toned appearances can be to use an outer housing that is comprised entirely of a "radio transparent" material, such as a hard plastic. One drawback to this approach, however, is that metallic surface finishes are thought by some to be more aesthetically pleasing than plastic surface finishes. In general, metallic surface finishes have a look and feel that tends to be harder, smoother and sleeker than plastic surface finishes. Thus, with respect to a portable electronic device that must be able to communicate via electromagnetic waves, a designer has traditionally needed to choose at least one of the lesser aesthetically pleasing alternatives involving an external antenna, a seam or seams on the outer housing, or an outer housing made entirely of plastic or some other radio transparent material.

While many designs and methods of manufacture for providing outer housings on portable computing devices and other similar items have generally worked well in the past, there is always a desire to provide new and improved designs that result in aesthetically pleasing and functional outer housings for such portable computing devices. In particular, it is desirable to provide a portable computing device that can communicate via electromagnetic waves, have an internal antenna, have no seams in the outer housing, and have an outer housing with a sleek and hard finish that is metallic or similar thereto.

SUMMARY

It is an advantage of the present invention to provide an aesthetically pleasing outer housing for a portable computing device, such as a cellular telephone or media player. Such an outer housing should be usable for a portable computing device adapted to communicate via electromagnetic waves, have an internal antenna, have no seams in the outer housing, and have an outer housing with a sleek and hard finish that is metallic or similar thereto. This can be accomplished at least in part through the use of a ceramic thermal spray coating that is applied to the outer surface or surfaces of one or more outer housing components of the computing device.

In various embodiments, the invention can include an electronic device having an outer housing configured to enclose at least a portion of the electronic device and having an outer surface, an internal antenna located fully within the outer housing, said receiver being adapted to receive communications from an outside source via electromagnetic waves, and a ceramic coating that covers at least a portion of the outer surface proximate the internal antenna, wherein the ceramic coating is adapted to allow communications to the internal antenna via electromagnetic waves.

In various detailed embodiments, a portable, handheld, personal computing device is provided. This device can include a plurality of internal operational components adapted to provide processing for a user thereof, a metal outer housing configured to enclose at least a portion of the internal operational components, said metal outer housing having a first outer surface and an opening therethrough, an internal antenna located fully within the metal outer housing, said internal antenna being adapted to receive communications from an outside source via radio frequency waves, a processor located within the metal outer housing and coupled to the internal antenna, said processor being adapted to provide an output for a user as a result of communications from an outside source, an insert fitted within the opening in the metal outer housing such that a seam between the metal outer housing and the insert is formed, said insert being transparent to radio frequency waves and having a second outer surface, and a ceramic coating that covers the first outer surface and second outer surface such that the seam is hidden thereby, wherein said ceramic coating is also transparent to radio frequency waves.

In various embodiments, a radio transparent ceramic coating can be applied using a thermal spray process. This allows for the use of a plastic or other radio transparent material, such that an internal antenna can be used, and also results in a hard and sleek ceramic finish for the outer housing. Any seam or seams between different outer housing components can be covered by the thermal spray ceramic material to provide a final seamless ceramic look and finish.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures and arrangements for the disclosed inventive apparatus and method for providing an outer housing for a personal computing device by using a thermal spray coating. These drawings in no way limit any changes in form and detail that may be made to the invention by one skilled in the art without departing from the spirit and scope of the invention.

DETAILED DESCRIPTION

Figure 1A:
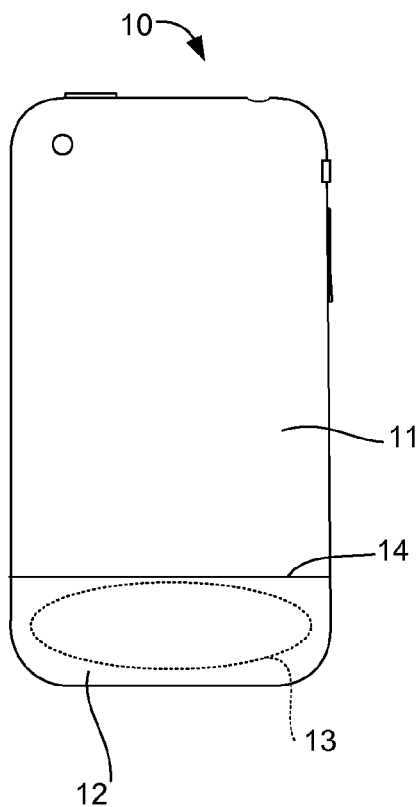
FIG. 1A illustrates in back plan view the obverse side of an exemplary cellular telephone having a metal and plastic housing and a two-toned overall appearance.

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

The invention relates in various embodiments to aesthetically pleasing outer housings for a portable personal computing device, such as an iPod® media player or iPhone® cellular telephone made by Apple Inc., among other suitable devices or items. Such outer housings can be generally tubular and handheld in nature, although the exact shape and size can vary. In addition, such outer housings are preferably adapted to allow for the transmission of electromagnetic waves, such that radio frequency ("RF") communications and other transmissions can be made through the outer housing. Further, these outer housings are preferably seamless, sleek and sufficiently hardened in look and feel.

In various embodiments of the present invention, an outer housing for a portable personal computing device is provided. Various embodiments may also include or relate to the entire portable personal computing device. The outer housing can be adapted to surround and protect a plurality of internal operational components for the computing device. The outer housing can include a single base component or a plurality of components assembled together to form a uniform outer housing. The one or more base components forming the outer housing can then be coated with a thermally sprayed material that is radio transparent, such as a ceramic. The thermally sprayed ceramic or other material can cover any seams between outer housing components, such that the device has a uniform, seamless, sleek and hardened finish that allows for radio communications with an internal antenna.

Although it is contemplated that the internal antenna for use with the present invention be fully or completely internal, other arrangements may also be used. For example, a mostly internal but partially external antenna may be used. Further, an extendable antenna that can be at least partially external in one position and fully internal in another position may also be used. This could result in the user having an option to extend an antenna if desired, while still providing good antenna service and reception in a fully internal position. Other alternative internal, external and combination antenna arrangements may be used, and the present invention is contemplated to be used with respect to any and all such arrangements.

Referring first to FIG. 1A, the obverse side of an exemplary cellular telephone having a metal and plastic housing and a two-toned overall appearance is illustrated in back plan view. As shown, cellular telephone 10 has a back surface housing having an aluminum component 11 and a plastic component 12, with the plastic component being located proximate to an internal antenna 13, such that RF transmissions can be made through the plastic component to the antenna. Because two different materials are used, a seam 14 exists between these metal and plastic housing components. As noted above, such a seam and two-toned appearance might be less aesthetically pleasing to some that a uniform outer housing.

Figure 1B:
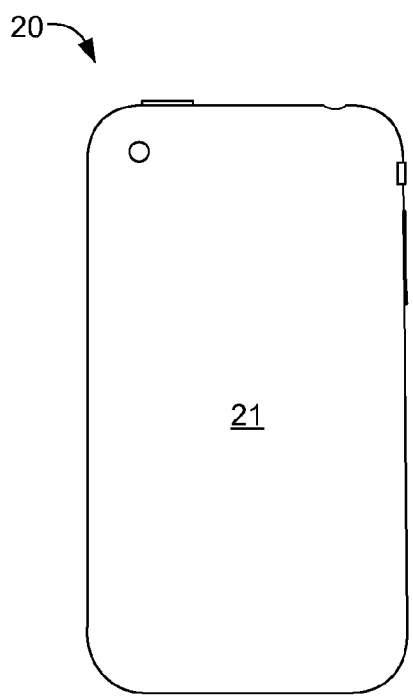
FIG. 1B illustrates in back plan view the obverse side of an alternative exemplary cellular telephone having a fully plastic outer housing and a uniform overall appearance.

Moving next to FIG. 1B, the obverse side of an alternative exemplary cellular telephone having a fully plastic outer housing and a uniform overall appearance is shown in back plan view. Cellular telephone 20 has a uniform plastic outer housing 21, such that RF transmissions can be made therethrough in all locations. However, as noted above, plastic finishes may be less aesthetically pleasing to some than metallic or similar finishes. Although the location of an internal antenna can be in the same general area as that which is shown in FIG. 1A, it will be appreciated such an internal antenna can be in virtually any other internal location, since the use of an "RF transparent" plastic for the entire housing provides flexibility in at least this regard.

Figure 2A:
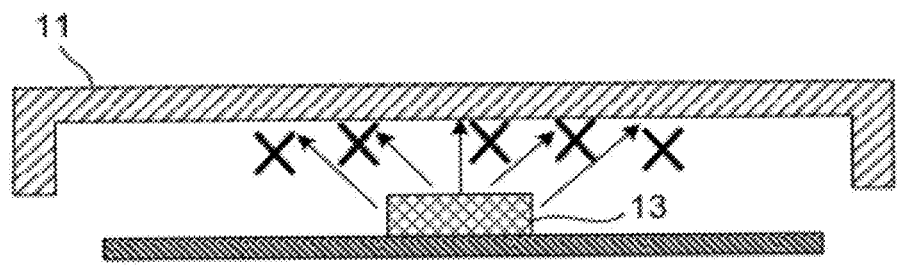
FIG. 2A illustrates in partial top cross-sectional view an exemplary cellular telephone having an internal antenna and a metal housing.
Figure 2B:
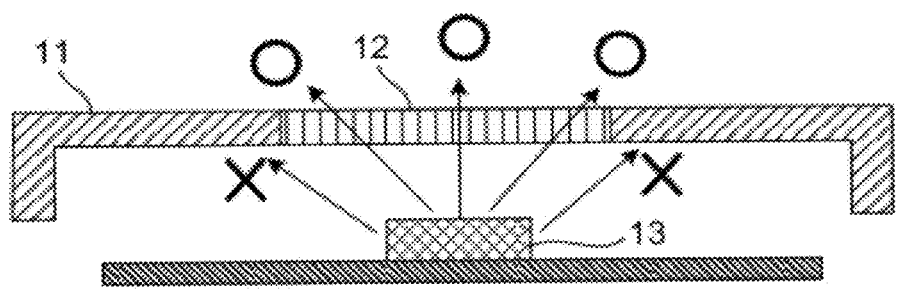
FIG. 2B illustrates in partial top cross-sectional view an alternative exemplary cellular telephone having an internal antenna a metal and plastic housing.
Figure 2C:
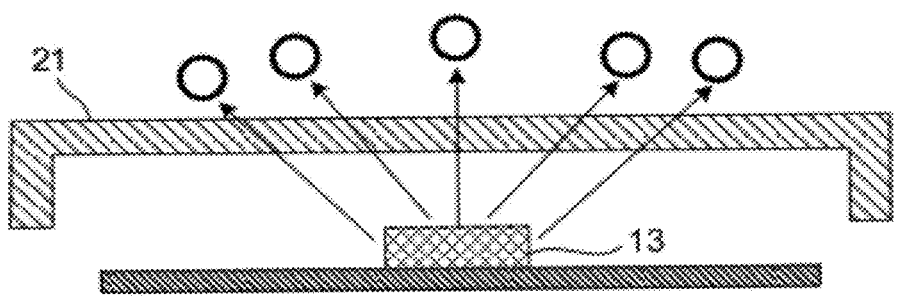
FIG. 2C illustrates in partial top cross-sectional view another alternative exemplary cellular telephone having an internal antenna and a fully plastic or glass housing.

Continuing to FIG. 2A-2C, various exemplary portable computing devices are depicted. In FIG. 2A, an exemplary cellular telephone having an internal antenna and a metal housing is shown in partial top cross-sectional view. As shown, the X notations indicate that no electromagnetic wave signal can be read by the antenna from a particular location. As would be expected, metal housing 11 generally does not allow for RF transmissions therethrough with respect to internal antenna 13. As such, the exemplary arrangement shown in FIG. 2A is generally impractical without the use of an external antenna or some RF transparent window in metal housing 11. The illustrated cross-section would be appropriate to show what happens in locations where there is no RF transparent window in a device housing, such as at the upper portions of cellular telephone 10 shown in FIG. 1A.

FIG. 2B illustrates in partial top cross-sectional view an alternative exemplary cellular telephone having an internal antenna within a metal and plastic housing. As shown, the X notations indicate that no electromagnetic wave signal can be read by the antenna from a particular location, but the O notations indicate that an electromagnetic wave signal from an outside source can be read by the internal antenna. This arrangement generally corresponds to that which is shown at the bottom portion of cellular telephone 10 in FIG. 1A, in that RF transmissions to the internal antenna 13 can be made through an RF transparent plastic portion 12 of the outer housing, but not through the metal portion 11 of the outer housing. As such, it is preferable that the internal antenna 13 be located proximate to the plastic portion 12 or other RF transparent region of the device.

FIG. 2C illustrates in partial top cross-sectional view another alternative exemplary cellular telephone having an internal antenna and a fully plastic or glass housing. This alternative arrangement generally corresponds to that which is shown in FIG. 1B, in that RF transmissions to the internal antenna 13 can be made through the entire plastic outer housing 21. As will be appreciated, there can be various drawbacks either functionally or aesthetically with respect to each of the embodiments shown in FIGS. 2A-2C. In general, all of these drawbacks are overcome in the various inventive embodiments disclosed and described herein.

Figure 3:
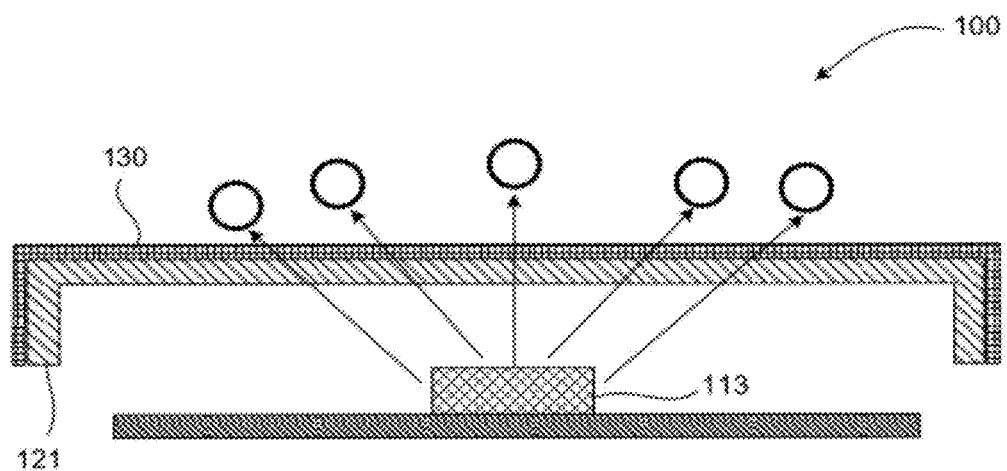
FIG. 3 illustrates in partial top cross-sectional view an exemplary cellular telephone having an internal antenna, a fully plastic housing and a thermal spray coating, according to one embodiment of the present invention.

Turning now to FIG. 3, an exemplary cellular telephone having an internal antenna, a fully plastic, glass or other RF transparent housing and a thermal spray coating is shown in partial top cross-sectional view, according to one embodiment of the present invention. Cellular telephone 100 has a fully internal antenna 113, with such a fully internal antenna being located entirely within the outer housing of the device. Although no antenna component is located outside the outer housing, it will appreciated that some embodiments may include such an element, as noted above. A plastic outer housing component 121 can fully or substantially house the entire cellular telephone 100, similar to the plastic outer housing 21 of FIGS. 1B and 2C. In addition, a thermal spray coating 130 is applied to the outer surface of plastic housing 121. This thermal spray coating can be a material that is radio (i.e., RF) transparent, such as ceramic, such that RF communications from an outside source can transmit through both the coating and plastic housing to reach the internal antenna. In some embodiments, the coating can cover all or substantially all of the plastic housing, such that a uniform and seamless surface is provided. Such a surface can be smoother, stiffer, harder, consistent and continuous than typical plastic materials, resulting in a more aesthetically pleasing outer appearance of the device.

Figure 4:
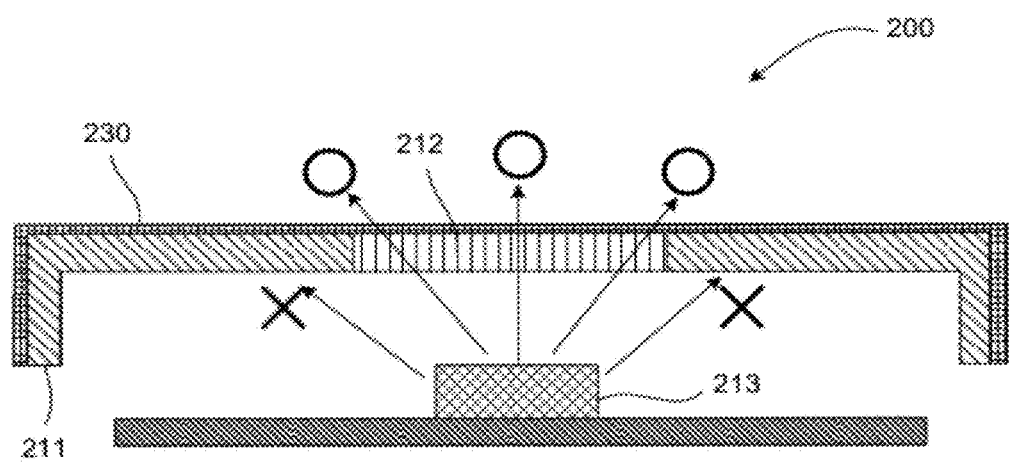
FIG. 4 illustrates in partial top cross-sectional view an alternative exemplary cellular telephone having an internal antenna, a metal and plastic housing and a thermal spray coating, according to another embodiment of the present invention.

FIG. 4 illustrates in partial top cross-sectional view an alternative exemplary cellular telephone having an internal antenna, a metal and plastic housing and a thermal spray coating, according to another embodiment of the present invention. Cellular telephone 200 can have a base outer housing component 211 made of metal, with such a metal housing component having one or more "windows" or openings therein. One or more inserts or other outer housing components 212 can fit into these windows or openings, preferably such that the surfaces are flush to create a mostly smooth and continuous outer surface. Such an insert or other housing component 212 can be an radio transparent material, such as plastic or glass, and can be placed proximate to an internal antenna 213, such that RF transmissions can be made from an outside source, through the insert 212 and to the internal antenna 213.

Such an arrangement is generally similar to that which is shown and described with respect to FIG. 1A above, with the aluminum and plastic outer housing components necessarily forming a seam between the two. Unlike the foregoing example, however, cellular telephone 200 also has a thermal spray coating 230 applied to the outer surfaces of both the metal housing component 211 and the radio transparent insert or housing component 212. Again, this thermal spray coating 230 can be a ceramic or other material that is radio transparent, such that RF communications can be made between an outside location and an internal antenna located entirely within the outer housing of the device. Advantageously, applying the thermal spray coating 230 results in a thin layer that covers the metal outer housing component 211, the plastic or glass insert or housing component 212, and any seams between the two. In some embodiments, the coating can cover all or substantially all of the metal and plastic housing components, such that a uniform and seamless outer surface is provided. As in the above embodiment, such a surface can be smoother, stiffer and harder than typical plastic materials, resulting in a more aesthetically pleasing outer appearance of the device while still permitting for RF communications. Such a finish is thus more consistent and continuous than that resulting from typical combinations of metal and plastic materials, resulting in a more aesthetically pleasing outer appearance of the device.

Figure 5:
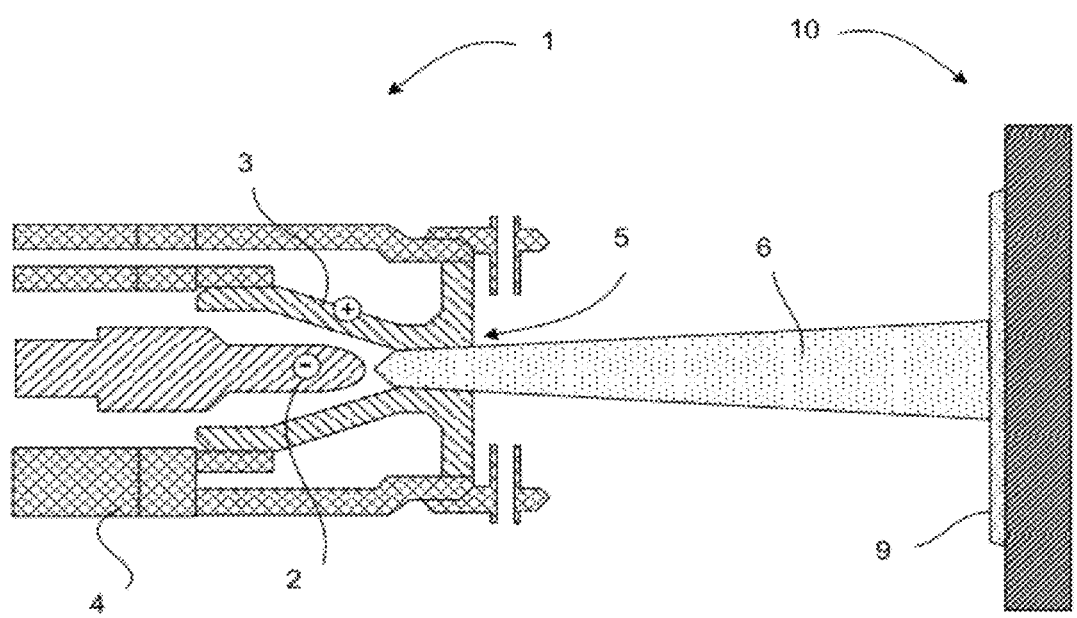
FIG. 5 illustrates in cross-sectional view an exemplary thermal spray process and various aspects thereof.

FIG. 5 illustrates in cross-sectional view an exemplary thermal spray process and various aspects thereof. A thermal spray process generally involves melting or otherwise breaking down a coating material into a fine powder that is then sprayed onto a surface using a plasma spray gun, a cross-section of which is illustrated. In general, a plasma spray gun 1 can include a negatively charged component 2 and a positively charged component 3 inside a housing 4 having an opening 5 for the ejection of thermal spray material 6. This thermal spray material can be sprayed onto an outside device 10, which results in the formation of a thermal spray coating 9 on the device.

Various materials can be used in such a thermal spray process, including metals, ceramics and cermets. Because metals and cermets tend to be poor transmitters for RF communications, it is preferable that the thermally sprayed material for use with the present invention be a ceramic powder material. Such a ceramic can be, for example, an aluminum based powder, a chromium oxide based powder, a titania based powder or a zirconium oxide based powder, among other suitable materials.

The ceramic thermal spray process contemplated for use with the present invention can be that which is provided by any number of vendors, such as, for example, Sulzer Metco of Westbury, N.Y.; Tocalo Co., Ltd. of Kobe-shi, Japan; or Plasma Giken Koygo, Co. Ltd., of Tokyo, Japan. Other vendors may also be used for this process, as may be applicable. In general, any suitable thermal spray process that involves the use of a plasma spray gun or other similar device to effectively "paint" or coat a thin layer onto a surface can be used with the present invention. In particular, such a layer should be a ceramic or other radio transparent material.

Although many typical thermal spray processes use powders having granules on the order of 100 microns in diameter, it is though that granules of this size may be too large for an aesthetically pleasing smooth surface finish on a portable computing device, as described in detail above. As such, it is contemplated that a thermal spray process using smaller granule sizes can be used with for the present invention. For example, a fine powder thermal spray can be used having granules that are about 10 or even 5 microns in diameter, on average. This can result in a smoother surface finish on the final product.

In some embodiments, particularly where granules of a larger diameter are used in the thermal spray process, a finishing step might be employed to polish or otherwise smooth out the outer surface of the thermal spray layer after it has been applied to the outer surface(s) of the outer housing component(s). For example, a diamond powder sanding process might be used to polish or smooth out the final outer surface. Such a final finishing step can improve the overall look of the portable computing device to be as aesthetically pleasing as possible.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. A portable, handheld, personal computing device, comprising:
    a plurality of internal operational components adapted to provide processing for a user thereof;
    a metal outer housing configured to enclose at least a portion of said internal operational components, said metal outer housing having a first outer surface and an opening therethrough;
    an internal antenna located within said metal outer housing, said internal antenna being adapted to receive communications from an outside source via radio frequency waves;
    a processor located within said metal outer housing and coupled to said internal antenna, said processor being adapted to provide an output for said user as a result of said communications from an outside source;
    an insert fitted within the opening in said metal outer housing such that a seam between said metal outer housing and said insert is formed, said insert being transparent to radio frequency waves and having a second outer surface; and
    a ceramic coating that is thermally sprayed to cover at least a portion of said first outer surface and at least a portion of said second outer surface such that said seam is hidden thereby, wherein said thermally sprayed ceramic coating is also transparent to radio frequency waves.

2. The portable, handheld, personal computing device of claim 1, wherein said internal antenna is located fully within said outer housing.

3. The portable, handheld, personal computing device of claim 1, wherein said ceramic coating comprises a thermal spray coating.

4. The portable, handheld, personal computing device of claim 3, wherein said thermal spray coating comprises a fine powder thermal spray having granules that are primarily about 10 microns or less in diameter.

5. The portable, handheld, personal computing device of claim 1, wherein said outer housing is adapted to allow communications to said internal antenna therethrough via electromagnetic waves.

6. The portable, handheld, personal computing device of claim 5, wherein said outer housing comprises a plastic material.

7. The portable, handheld, personal computing device of claim 5, wherein said electromagnetic waves comprise radio frequency waves.

8. The portable, handheld, personal computing device of claim 1, wherein said outer housing further includes an opening therethrough.

9. The portable, handheld, personal computing device of claim 1, wherein said ceramic coating provides a smooth and consistent finish for the device.

10. The portable, handheld, personal computing device of claim 1, wherein said portable, handheld, personal computing device comprises a cellular telephone.

11. The portable, handheld, personal computing device of claim 1, wherein said ceramic coating covers substantially all of said first and second outer surfaces.

12. The portable, handheld, personal computing device of claim 1, wherein said thermally sprayed ceramic coating comprises a fine powder thermal spray having granules that are primarily about 5 microns or less in diameter.

13. The portable, handheld, personal computing device as recited in claim 1 wherein at least a portion of the metal outer housing is plastic.

14. The portable, handheld, personal computing device as recited in claim 1 wherein the metal outer housing is aluminum.

15. The portable, handheld, personal computing device as recited in claim 1 wherein said thermally sprayed ceramic coating ceramic is selected from a group comprising: an aluminum based powder, a chromium oxide based powder, a titania based powder, and a zirconium oxide based powder.

16. The portable, handheld, personal computing device of claim 1, wherein said ceramic coating provides a continuous and unbroken finish across the device.

17. A method of forming a portable, handheld, personal computing device, comprising:
    providing a metal outer housing configured to enclose at least a portion of a plurality of internal operational components, said metal outer housing having a first outer surface and an opening therethrough;
    enclosing at least the portion of the plurality of internal operational components adapted to provide processing for a user thereof within the metal outer housing;

placing an internal antenna within said metal outer housing, said internal antenna being adapted to receive communications from an outside source via radio frequency waves;

placing a processor within said metal outer housing and coupling said processor to said internal antenna, said processor being adapted to provide an output for said user as a result of said communications from an outside source;

fitting an insert within the opening in said metal outer housing such that a seam between said metal outer housing and said insert is formed, said insert being transparent to radio frequency waves and having a second outer surface; and thermally spraying a ceramic coating to cover at least a portion of said first outer surface and at least a portion of said second outer surface such that said seam is hidden thereby, wherein said thermally sprayed ceramic coating is also transparent to radio frequency waves.

18. The method of claim 17, wherein said portable, handheld, personal computing device comprises a cellular telephone.

19. The method of claim 17, wherein said ceramic coating comprises a thermal spray coating.

20. The method of claim 19, wherein said thermal spray coating comprises a fine powder thermal spray having granules that are primarily about 10 microns or less in diameter.

21. The method of claim 20, wherein said ceramic coating provides a smooth and consistent finish for the portable, handheld, personal computing device.

22. The method of claim 20, wherein said ceramic coating covers substantially all of said first and second outer surfaces.

23. The method as recited in claim 17, wherein at least a portion of the metal outer housing is plastic.

24. The method as recited in claim 17 wherein the metal outer housing is aluminum.

25. The method as recited in claim 17 wherein said thermally sprayed ceramic coating ceramic is selected from a group comprising: an aluminum based powder, a chromium oxide based powder, a titania based powder, and a zirconium oxide based powder.

26. The method of claim 17, wherein said ceramic coating provides a continuous and unbroken finish across the device.

27. The method of claim 17, wherein a plasma gun is used for said thermal spraying.

* * * * *